US008384069B2

(12) United States Patent
Pernel et al.

(10) Patent No.: US 8,384,069 B2
(45) Date of Patent: Feb. 26, 2013

(54) SEMICONDUCTOR STRUCTURE HAVING BLOCKS CONNECTED BY NANOWIRES

(75) Inventors: Carole Pernel, St Égrève (FR); Cécilia Dupre, Bonsecours (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 217 days.

(21) Appl. No.: 12/782,364

(22) Filed: May 18, 2010

(65) Prior Publication Data

US 2010/0295024 A1    Nov. 25, 2010

(30) Foreign Application Priority Data

May 19, 2009    (FR) ..................................... 09 53309

(51) Int. Cl.
*H01L 29/08* (2006.01)
*H01L 35/24* (2006.01)
*H01L 51/00* (2006.01)
*H01L 29/06* (2006.01)
*H01L 31/00* (2006.01)
*H01L 21/00* (2006.01)
*H01L 21/20* (2006.01)
*H01L 21/36* (2006.01)

(52) U.S. Cl. ..................... 257/40; 257/24; 257/E29.245; 257/E21.09; 438/52; 438/53; 438/478; 428/138; 977/750; 977/752; 977/843; 977/855; 977/856; 977/857; 977/858

(58) Field of Classification Search ......................... None
See application file for complete search history.

(56) References Cited

U.S. PATENT DOCUMENTS

| 2010/0022082 A1* | 1/2010 | Louis ............................. 438/618 |
| 2011/0097631 A1* | 4/2011 | Lee et al. ....................... 429/400 |
| 2011/0127492 A1* | 6/2011 | Chang et al. .................... 257/24 |

FOREIGN PATENT DOCUMENTS

WO    WO 2007/126412    11/2007

OTHER PUBLICATIONS

Choi, Yang-Kyu et al.; "Sub-20nm CMOS FinFET Technologies"; Department of Electrical Engineering and Computer Sciences, University of California, Berkeley, CA 94720, USA; Lawrence Berkeley National Laboratory; 2001; 19.1.1-19.1.4, IEEE, 2001.

(Continued)

*Primary Examiner* — N Drew Richards
*Assistant Examiner* — Michael Jung
(74) *Attorney, Agent, or Firm* — Pillsbury Winthrop Shaw Pittman, LLP (57) ABSTRACT

A semiconductor structure includes a support and at least one block provided on the support. The block includes a stack including alternating layers based on a first semiconductor material and layers based on a second semiconductor material different from the first material, the layers presenting greater dimensions than layers such that the stack has a lateral tooth profile and a plurality of spacers filling the spaces formed by the tooth profile, the spacers being made of a third material different from the first material such that each of the lateral faces of the block presents alternating lateral bands based on the first material and alternating lateral bands based on the third material. At least one of the lateral faces of the block is partially coated with a material promoting the growth of nanotubes or nanowires, the catalyst material exclusively coating the lateral bands based on the first material or exclusively coating the lateral bands based on the third material.

20 Claims, 5 Drawing Sheets

OTHER PUBLICATIONS

Ernst, T. et al.; "Novel 3D integration process for highly scalable Nano-Beam stacked-channels GAA (NBG) FinFETs with Hf0$_2$/TiN gate stack"; IEEE, 2006.

Glickman, E. et al.; "Electroless deposition and electrical resistivity of sub-100 nm Cu films on SAMs: State of the art"; Physical Electronics Department, Tel Aviv University, 69978 Ramat Aviv, Israel; May 17, 2007; Microelectronic Engineering 84 (2007) 2466-2470.

Aswal, D.K. et al.; "Self assembled monolayers on silicon for molecular electronics", Institut d'Electronique, Microelectronique et Nanotechnologie—CNRS "Molecular Nanostructures & Devices"—Villeneuve d'Ascq, France, Technical Physics and Prototype Engineering Division, bhabha Atomic Research Center—Mumbai, India; Jul. 13, 2005, Analytica Chimica Acta 568 (2006) 84-108.

* cited by examiner

SEMICONDUCTOR STRUCTURE HAVING BLOCKS CONNECTED BY NANOWIRES

CROSS-REFERENCE TO RELATED APPLICATIONS

This application is based upon and claims the benefit of priority from French Patent Application No. 09/53309, filed May 19, 2009, the entire contents of which are incorporated herein by reference.

The present invention relates to a semiconductor structure as well as to a method of producing this semiconductor structure. The invention finds a particularly interesting application in the field of electronic components based on nanowires from semiconductor materials (Si, Ge, SiGe, GaAs, etc.) or based on nanotubes, typically carbon nanotube semiconductors.

Over the past few years, interest in nano-object microelectronics, for example semiconductor nanowires or carbon nanotubes, known as CNT, has been widely demonstrated.

This is the case, for example, with field effect transistors having a semiconductor nanowire channel structure enabling two normally incompatible factors to be improved: their operating speed and consumption.

To increase operating speed, the size of the transistors, in particular, may be reduced; however, the fact of reducing transistor size involves, for example, bringing the source and drain closer together and making a channel with an increasingly shorter length. This may lead to effects that are harmful to the proper operation of transistors, such as short channel effects. Therefore, as the length of the transistor channel is reduced, the drain and source have an increasingly stronger influence on channel conduction, normally controlled by the gate. "Short channel effects" result in, among other effects, a reduction in threshold voltage with the channel length and drain voltage, which leads to an increase in transistor leakage in the off state. This is hardly compatible with improving integrated circuit performance.

A known solution to the problems mentioned above consists of proposing transistors comprising a channel formed of several semiconductor nanowires allowing the short channel effects to be reduced.

A known method for forming silicon semiconductor nanowires is growth by VLS-CVD (Vapor-Liquid-Solid-Chemical-Vapor-Deposition). The first works relating to this method debuted in the 60s. The principle of this technique consists of depositing a gold particle on the surface of a substrate and then heating the assembly to a temperature approaching 400° C. The gold particles previously deposited on the substrate form a eutectic mixture with the Si at 343° C. A gas flow, $SiCl_4$ for example, enables the Si to be reduced on the drops of the Au—Si mixture that plays the role of catalyst. The drops of the Au—Si mixture absorb the Si that precipitates, resulting in the growth of Si nanowires. Since 2000, works such as MBE (Molecular Beam Epitaxy) and CBE (Chemical Beam Epitaxy) metal catalysis, that enable better control of the chemical composition, crystal structure, defects and doping conditions of the nanowires, have complemented this technique. However, with such a type of method, control of the positioning, organization and distribution of nanowires is very difficult to obtain.

An alternative to this bottom-up approach, allowing freedom from the aforementioned problems, consists of using a top-down approach. Such an approach, for example, is described in the article "Novel 3D integration process for highly scalable Nano-Beam stacked channels GAA (NBG) FinFETs with HfO2/TiN gate stack" (Ernst et al.—IEEE International Electron Devices Meeting IEDM, pp. 997-999, Technical Digest 2006). This process particularly allows multichannel field effect transistors utilizing a matrix of silicon nanowires distributed both horizontally and vertically to be obtained. To do this, the first step consists of growing by epitaxy a superlattice composed of a stack of thin layers on a substrate of the semiconductor on insulator or SOI (Silicon On Insulator) type. The stack is, for example, formed by alternating layers based on a first material such as SiGe and layers based on a second material such as Si. The nanowire matrix is then obtained by electron beam lithography and then by successive steps of anisotropic etching and then isotropic and selective etching.

However, this process also presents certain difficulties. In fact, the density of nanowires obtained is limited by the "pitch," that is, the spacing between two wires in the direction parallel to the wafer. To obtain reduced spacing, it is therefore indispensable to use electron beam lithography (or "ebeam" lithography) or any other advanced lithography technique (such as, for example, Extreme Ultra Violet EUV lithography) offering better resolution than photolithography. However, continuing to reduce the distance between nanowires appears to be difficult, due to proximity effects (backscattering of electrons) in the case of electron beam lithography. This relatively wide spacing between nanowires makes increasing the current density released for a nanowire matrix of fixed size difficult. This limitation thus presents a major disadvantage inasmuch as interest in nanowire matrix transistors resides precisely in the fact of seeking a high nanowire density in order to obtain a high current density compensating for the low current density released by a single nanowire, particularly with relation to a conventional planar transistor.

This spacing problem may be resolved by utilizing spacers in order to double or even quadruple the columns of wires; such a technique is particularly described in the article "Sub-20 nm CMOS FinFET Technologies" (Choi et al.—IEDM Tech. Dig., p. 421, 2001). Nevertheless, such a technique involves additional steps, considerably complicating the process.

In addition, none of the top-down approaches described above for obtaining a three-dimensional structure allow the integration of nanotubes such as carbon nanotubes, the latter obtained only by growth. An example of the horizontal integration of carbon nanotubes is described in patent application WO2007/126412. According to this document, the CNTs are organized in the plane of the substrate; consequently, this technique does not enable three-dimensional CNTs to be obtained.

In this context, the object of the present invention is to provide a semiconductor structure free from the aforementioned problems and integrating three-dimensional nanowires or nanotubes, such as carbon nanotubes, according to a bottom-up approach, allowing a high density of nanowires or nanotubes to be obtained.

For this purpose, the invention proposes a semiconductor structure comprising:
  a support;
  at least one block built on said support, said block comprising:
    a stack including alternating layers based on a first semiconductor material and layers based on a second semiconductor material different from said first semiconductor material, said layers based on said first semiconductor material presenting greater dimensions than the layers based on said second semiconductor material such that said stack has a lateral tooth profile;

a plurality of spacers filling the spaces formed by said tooth profile such that said stack presents a substantially flat lateral surface, said spacers being made of a third material different from said first semiconductor material such that each of the lateral faces of said block presents alternating lateral bands based on said first material and lateral bands based on said third material;

at least one of the lateral faces of said block being partially covered by a material promoting the growth of nanotubes or nanowires exclusively on the lateral bands based on said first semiconductor material or exclusively on the lateral bands based on said third material, said material promoting the growth of nanotubes or nanowires exclusively coating the lateral bands based on said first semiconductor material or exclusively the lateral bands based on said third material.

Thanks to the invention, a nanostructure comprising at least one bimaterial vertical lateral face (with relation to the horizontal substrate) is obtained. In other words, this vertical lateral face is composed of alternating bands made of two different materials, typically a semiconductor material (the first semiconductor material), such as Si, and an insulating material (the third material) such as, for example, nitride $Si_3N_4$. These alternating bands of different materials allow one series of bands (for example bands of Si as the first material) to be coated with a catalyst material for the growth of nanotubes or nanowires, for example in the form of gold particles (nanodots) for growing silicon nanowires. This catalytic coating is selective; in other words, the catalyst material only coats the first series of bands made of the first material and does not coat the bands made of the third material forming spacers. The coating may, for example, be obtained by functionalization of the silicon surface or by siliconizing the silicon surface (i.e. formation of NiSi). Such a structure enables nanowires or nanotubes to be grown on several levels from the vertical lateral surface.

It will be noted that it is also possible to make the catalytic coating selective on the bands formed by the spacers (for example, metal spacers). These catalytic coatings may then be obtained by electrolytic deposition on the metal spacers.

Generally, the bimaterial surface allows the catalyst to be only deposited on bands based on one of the two materials and then nanowires or nanotubes to be grown from the vertical lateral surface. The structure according to the invention allows nanowires or nanotubes to be grown to obtain a matrix by eliminating the lithography step (see the article "Novel 3D integration process for highly scalable Nano-Beam stacked channels GAA (NBG) FinFETs with HfO2/TiN gate stack" (Ernst et al.—IEEE International Electron Devices Meeting IEDM, pp. 997-999, Technical Digest 2006) previously cited). In this way, the structure enables nanowires with a much reduced spacing between them (typically 10 nm versus 80 nm for processes utilizing lithography) to be integrated. This configuration thus enables the nanowire integration density and current density released by a matrix of fixed size to be increased.

The structure according to the invention may also present one or more of the characteristics below, considered individually or according to all technically possible combinations:

the material is a catalyst material for the growth of nanotubes or nanowires;

the structure according to the invention comprises two blocks facing each other such that the lateral bands of said two blocks coated with said material promoting the growth of nanotubes or nanowires are facing each other;

said two blocks are connected by a plurality of nanowires or nanotubes, each of said nanowires or said nanotubes connecting a lateral band of the first block coated with the material promoting the growth of nanotubes or nanowires to a lateral band of the second block coated with the material promoting the growth of nanotubes or nanowires and facing the lateral band of said first block;

said material promoting the growth of nanotubes or nanowires partially coats said lateral bands in the form of particles or "nanodots" spaced along said bands;

the thickness of said layers based on said first semiconductor material and/or said layers based on said second semiconductor material is between 10 and 50 nm;

said first semiconductor material is Si and said second semiconductor material is SiGe;

said spacers are made from an insulating material, said material promoting the growth of nanotubes or nanowires exclusively coating the lateral bands based on said first semiconductor material;

said spacers are formed by a first part made of a first dielectric material such as HTO (High Thermal Oxide) $SiO_2$ and a second part made of a second dielectric material such as silicon nitride of the $Si_3N_4$ type, said second dielectric material corresponding to said third material of the lateral bands;

said third material of said spacers is a metal, said material promoting the growth of nanotubes or nanowires exclusively coating the lateral bands based on said metal;

Said support is a substrate comprising a semiconductor layer such as an SOI (silicon on insulator), Si or Ge substrate.

Another object of the present invention is a method of producing a semiconductor structure comprising:

a support;

at least one block built on said support, said block comprising:

a stack including alternating layers based on a first semiconductor material and layers based on a second semiconductor material different from said first semiconductor material, said layers based on said first semiconductor material presenting greater dimensions than the layers based on said second semiconductor material such that said stack has a lateral tooth profile;

a plurality of spacers filling the spaces formed by said tooth profile such that said stack presents a substantially flat lateral surface, said spacers being made of a third material different from said first semiconductor material such that each of the lateral faces of said block presents alternating lateral bands based on said first material and lateral bands based on said third material;

said method comprising a step of partially coating at least one of the lateral faces of said block with a material promoting the growth of nanotubes or nanowires exclusively on the lateral bands based on said first semiconductor material or exclusively on the lateral bands based on said third material, said coating step being selective such that said material promoting the growth of nanotubes or nanowires exclusively coats the lateral bands based on said first semiconductor material or exclusively the lateral bands based on said third material.

The method according to the invention may also present one or more of the characteristics below, considered individually or according to all technically possible combinations:

the material promoting the growth of nanotubes or nanowires is a catalyst material for the growth of nanotubes or nanowires said coating step is a functionalization step for the lateral bands based on said first semiconductor material followed by a step of depositing metal on the functionalized bands;

said first semiconductor material is silicon and said coating step is a siliconizing step;

said third material is a metal and said coating step is a step for electrolytically depositing a metal on the lateral bands based on said third material;

The method according to the invention comprises the following steps:

formation of a stack of semiconductor layers on a support, said stack including alternating stacked layers based on a first semiconductor material and layers based on a second semiconductor material different from said first semiconductor material, and comprising on its sides a tooth profile formed by grooves based on said second semiconductor material and projecting parts based on said first semiconductor material;

Producing spacers filling the grooves formed by said tooth profile;

said spacers are insulating spacers, the production of said spacers comprising the following steps:

conformal deposition of a first dielectric material on the stack with a tooth profile;

deposition of a second dielectric material;

Selective and partial removal of the second dielectric material with regard to the first dielectric material.

Another object of the present invention is a transistor integrating a structure according to the invention comprising a plurality of nanowires or nanotubes, each forming a transistor channel.

Other characteristics and advantages of the invention will clearly emerge from the description given below, for indicative and in no way limiting purposes, with reference to the attached figures, among which.

In all figures, common elements bear the same reference numbers.

In the following we will refer to an orthogonal mark [o, i, j, k] in which the plane [o, i, k] defines the plane of the sheet and vector j is perpendicular to the plane of the sheet.

Figure 1:
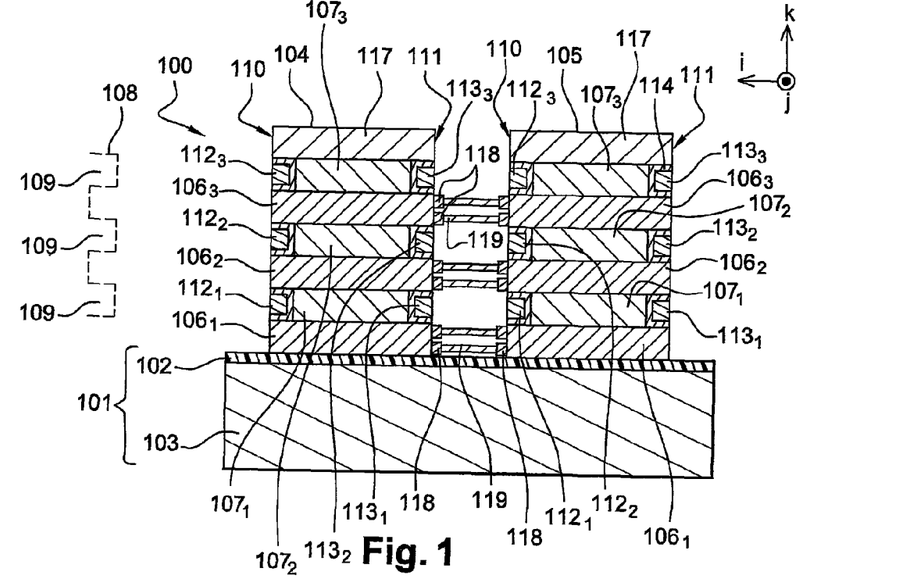
FIG. 1 represents a semiconductor structure according to a first embodiment of the invention.

FIG. 1 represents a semiconductor structure 100 according to a first embodiment of the invention.

Structure 100 comprises:

a support 101 comprising:

a first semiconductor layer 102, for example based on silicon on which is built;

an insulating layer 103, such as a layer of buried oxide based on $SiO_2$;

two semiconductor blocks 104 and 105 spaced along the horizontal direction i.

Plane [o, i, j] corresponds to the horizontal plane of support 101.

Each of the two blocks 104 and 105 have an identical structure and comprise a stack of layers stacked along the vertical direction k. This stack is formed of alternating layers noted $106_1$, $106_2$ and $106_3$ based on a first semiconductor material, such as for example Si, and layers noted $107_1$, $107_2$ and $107_3$ based on a second semiconductor material different from the first semiconductor material, such as for example SiGe. The second material is preferentially chosen to be able to be etched selectively with relation to the first material. Each of the two blocks 104 and 105 comprises, in addition, a hard mask upper layer 117, for example of $Si_3N_4$.

Layers $106_1$, $106_2$ and $106_3$ based on the first semiconductor material and layers $107_1$, $107_2$ and $107_3$ based on the second semiconductor material typically have thicknesses along direction k of between 10 and 50 nm.

The lengths along direction i of layers $106_1$, $106_2$ and $106_3$ based on the first semiconductor material are chosen longer than the lengths of layers $107_1$, $107_2$ and $107_3$ based on the second semiconductor material such that alternating layers $106_1$, $106_2$ and $106_3$ and alternating layers $107_1$, $107_2$ and $107_3$ have a tooth or recessed lateral profile. This profile is illustrated by broken lines 108 in FIG. 1.

The result is that each block 104 and 105 comprises, on each of its two lateral faces 110 and 111, a tooth profile with "grooves" in SiGe and projecting relief parts in Si. Each block 104 and 105 thus presents an organized vertical topography wherein the dimensions are controlled via the thickness of layers of Si and of SiGe. Spaces 109 formed by the tooth profile 108 are totally filled on each of the lateral faces 110 and 111 respectively by insulating spacers $112_1$, $112_2$ and $112_3$ (lateral face 110) and by insulating spacers $113_1$, $113_2$ and $113_3$ (lateral face 111). Here the spacers are made in the form of substantially parallelepiped bars made of a dielectric material such as silicon nitride of the $Si_3N_4$ type. For technological reasons connected to the manufacturing method that we will explain subsequently by referring to FIGS. 3a to 3i, the spacers may also be partially enveloped by a layer 114 made in another dielectric material such as HTO type $SiO_2$.

Figure 2:
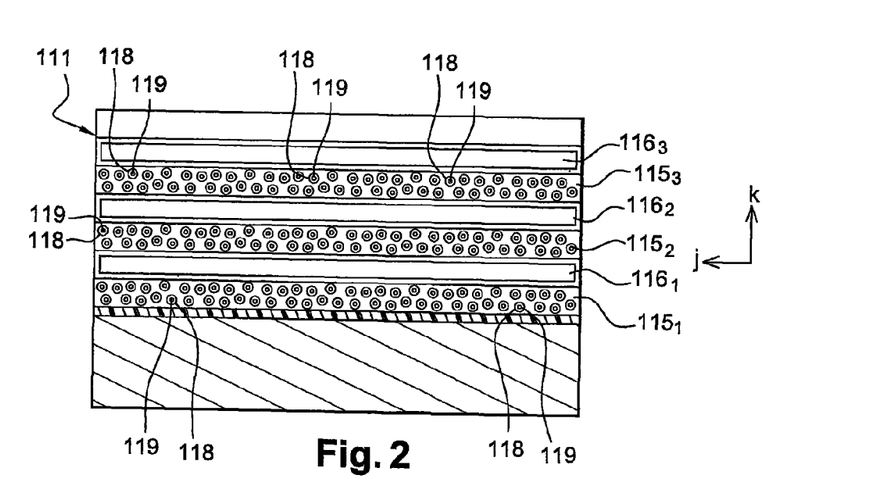
FIG. 2 represents a view of the lateral face of one of the blocks of the semiconductor structure from FIG. 1.

FIG. 2 represents a view along plane [O, j, k] of the lateral face 111 of block 104. This face 111 comprises alternating bands noted $115_1$, $115_2$ and $115_3$ based on the first semiconductor material (typically Si) and bands noted $116_1$, $116_2$ and $116_3$ based on the dielectric material, such as silicon nitride of the $Si_3N_4$ type.

Bands $115_1$, $115_2$ and $115_3$ based on the first semiconductor material are coated with a catalyst material able to facilitate the growth of nanotubes (typically CNT carbon nanotubes) or nanowires (typically semiconductor nanowires such as Si nanowires). This coating takes the form of particles 118 or nanodots. For example, Au particles (coating bands $115_1$, $115_2$ and $115_3$ based on Si) that constitute an excellent catalyst for the growth of Si nanowires, may be utilized. As we will see later during the description of the method for obtaining structure 100, this nanodot 118 coating may be, for example, obtained by functionalization of the Si surface. It will be noted that the fact of having two different materials for two types of bands $115_1$, $115_2$ and $115_3$ (in Si) and $116_1$, $116_2$ and $116_3$ (insulating) allows bands $115_1$, $115_2$ and $115_3$ to be selectively coated with the catalyst material without coating bands $116_1$, $116_2$ and $116_3$.

Then these particles 118 will be utilized to carry out horizontal growth of nanowires 119 in the confined structure existing between lateral surface 111 of block 104 and lateral surface 110 of block 105. It will be noted that, thanks to the structure according to the invention, it is not only possible to obtain a vertical stack (along direction k) of nanowires but also a horizontal distribution (along direction j) of nanowires such that a three-dimensional organization of nanowires is obtained. Thus, the structure enables, in particular, a multichannel structure to be obtained utilizing a matrix of silicon nanowires distributed both horizontally and vertically for producing multichannel field effect transistors.

First of all, structure 100 according to the invention enables nanowire/nanotube growth catalysts or precursors to be deposited on the bimaterial vertical lateral surfaces and then the growth of nanowires/nanotubes in the existing confined space of the lateral surfaces 111 and 110 of the two blocks 104 and 105.

The production method described above more specifically relates to the production of Si nanowires but the structure according to the invention more generally enables a stack of nanowires based on other semiconductor (typically Ge, SiGe, GaAs) or metallic materials but also nanotubes (graphene, Si) to be produced.

Structure 100 according to the invention described above finds a particularly interesting application with regards to the production of multichannel transistors, a nanowire being a transistor channel. From the structure 100 represented in FIG. 1, it is thus possible to produce a gate oxide around each nanowire 119; This gate oxide may be, for example, obtained by oxidation of the silicon of the nanowires 119 or by deposition of a dielectric layer ($HfO2$ for example). The thickness of the oxide layer is typically at least equal to 2 nm. Then a gate-all-around filling the volume existing between the gate oxides of nanowires 119 may be produced. Deposition of this gate-all-around may, for example, be obtained by the deposition of doped polysilicon or a mixture of metal and doped polysilicon. The gate deposition method is, for example, a CVD (Chemical Vapor Deposition) type method, used to obtain a conformal deposition that coats the nanowire 119 assembly.

FIGS. 3a to 3i illustrate the different steps of a method for producing the semiconductor structure 100 as represented in FIG. 1.

Figure 3A:
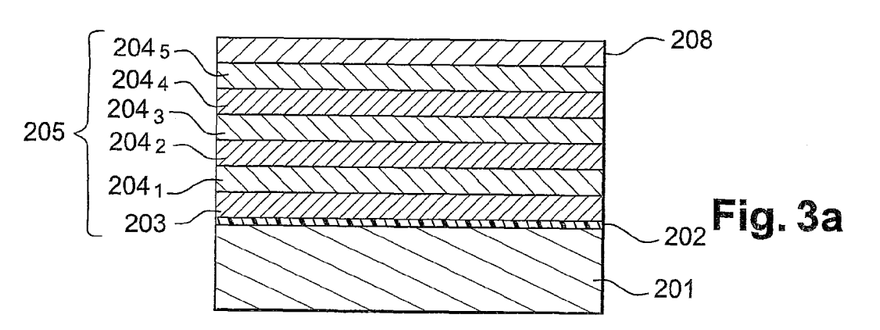
FIGS. 3a to 3i illustrate the different steps of a method for producing the semiconductor structure as represented in FIG. 1.

The first step of this method illustrated in FIG. 3a consists of stacking thin layers on a substrate, that may be of the semiconductor on insulator type, and comprises a first semiconductor layer 201, for example a silicon based layer, on which is built an insulating layer 202, for example a buried oxide layer based on $SiO_2$, itself covered by a second semiconductor layer 203. Here this second semiconductor layer 203 is based on a first semiconductor material such as Si.

A stack 205 is then produced formed by alternating layers noted 203, $204_2$ and $204_4$ based on the first semiconductor material Si and layers noted $204_1$, $204_3$ and $204_5$ based on a second material different from the first material, such as SiGe. The second material is a material likely to be able to be etched selectively with regards to the first material.

Layers $204_1, \ldots, 204_5$ are semiconductor layers formed, for example, of several successive epitaxies from the second semiconductor layer 203.

Once stack 205 is made, a hard mask layer 208 is deposited, the layer is, for example, based on a dielectric material such as $Si_3N_4$, or based on another material able to protect stack 205 from etching such as, for example, plasma etching. Then, a layer of photosensitive resin, not represented, for example a polyimide-based resin, is deposited on the hard mask layer 208, and a resin mask comprising at least one pattern for producing a trench is defined in the resin layer, for example by a photolithography method (known as "deep UV" lithography). It will be noted that the method according to the invention utilizes a standard lithography method and that it is not necessary to utilize electron beam lithography offering better resolution.

Then (FIG. 3b) anisotropic etching is carried out on the hard mask layer 208, for example a $CH_2F_2+HeO_2+CF_4$ based plasma etching.

Figure 3B:
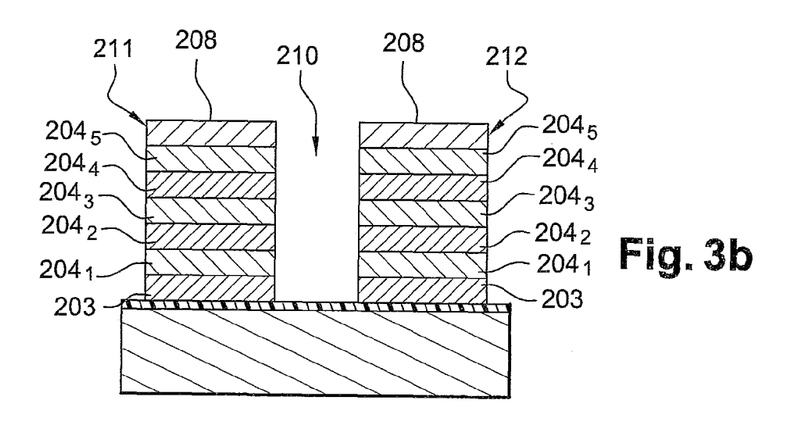

The invention then carries out a step of etching layers 203, $204_1, \ldots, 204_5$, situated under the hard mask 208, in order to reproduce the pattern of the latter in stack 205. The etching is anisotropic etching and is carried out, for example, by using an $HBr+Cl+HeO_2$-based plasma.

FIG. 3b represents trench 210 obtained after the anisotropic etching of stack 205, separating into two stacks 211 and 212, each comprising alternating layers 203, $204_1, \ldots, 204_5$, in Si and in SiGe.

Figure 3C:
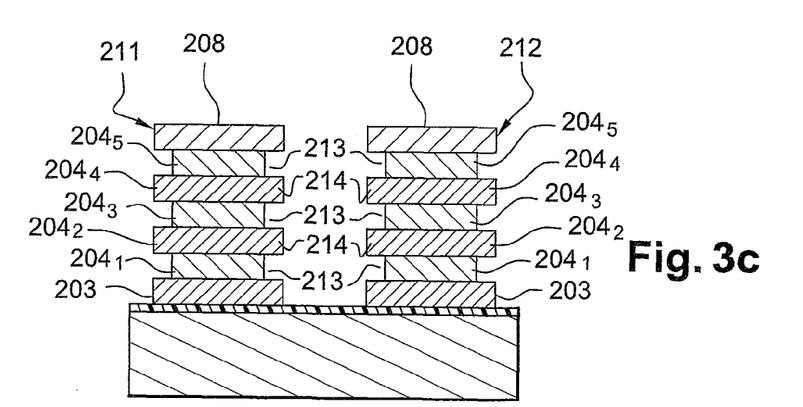

A second etching (FIG. 3c) is then carried out on each of stacks 211 and 212. This second etching is isotropic and selective, so as to partially remove some of layers 203, $204_1, \ldots, 204_5$ from stacks 211 and 212. In the present case, layers $204_1$, $204_3$ and $204_5$, for example, based on the second material (SiGe), are removed. Here, the etching is thus isotropic etching of the second semiconductor material SiGe, selective with regards to the first semiconductor material Si. Such etching may be carried out, for example, by using a $CF_4+O_2$-based plasma. As the tops of stacks 211 and 212 are protected by hard mask 208, the second etching enables portions of layers $204_1$, $204_3$ and $204_5$, based on the second material (SiGe), to be removed on both sides of each of stacks 211 and 212, at the sides or lateral faces of the latter (FIG. 3c). Layers 203, $204_2$ and $204_4$, based on the first semiconductor material Si, have longer spans than those of layers $204_1$, $204_3$ and $204_5$, based on the second semiconductor material SiGe.

The result is that, following the second etching step, each of stacks 211 and 212 comprises on its sides or on each of its lateral faces, a tooth profile formed by "grooves" 213 based on the second semiconductor material SiGe and projecting parts 214 based on the first semiconductor material Si.

Figure 3D:
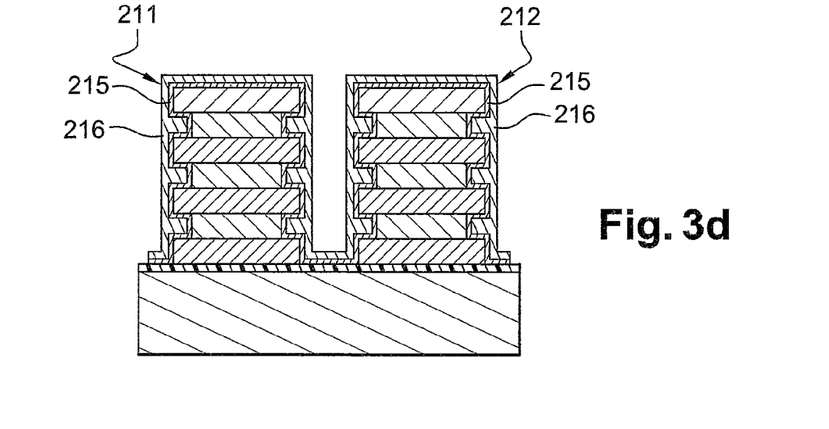
Figure 3E:
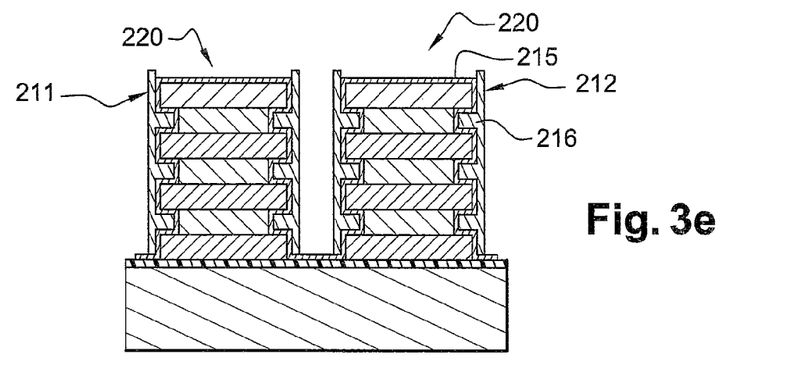

The next step, illustrated in FIG. 3d, consists of carrying out a conformal deposit of a first dielectric material 215, for example HTO (High Thermal Oxide) type $SiO_2$ covering the periphery of stacks 211 and 212 and used to protect (barrier layer) stacks 211 and 212 during a subsequent etching step.

In conformance with this same FIG. 3d, another deposition of a second dielectric material 216, for example of $Si_3N_4$, is then carried out so as to cover stacks 211 and 212 and fill in the "grooves" 213 based on the second semiconductor material SiGe.

The second dielectric material 216 is then removed so as to keep this material only in the "grooves" 213 based on the second semiconductor material SiGe.

This removal is carried out via a first anisotropic etching (FIG. 3e) of the second $Si_3N_4$ dielectric material 216, that is selective with regards to the first HTO dielectric material 215, for example by means of an $CF_4^+HBr$ plasma etching. This first etching enables the removal of the upper part 220 of the second $Si_3N_4$ dielectric material 216 but also the removal of this second material 216 on the horizontal surfaces at the bases of structures 211 and 212.

Then (FIG. 3f), isotropic etching of the second $Si_3N_4$ dielectric material 216 is carried out, that is selective with regards to the first HTO dielectric material 215, for example by means of an $SF_6+HBr$ plasma etching. This etching is carried out so as to partially remove the second $Si_3N_4$ dielectric material 216 only on the lateral parts 221 of stacks 211 and 212. Spacers 217 are thus formed, filling the spaces formed by "grooves" 213 based on the second semiconductor material SiGe. The isotropic etching is such that, after spacers 217 are formed, each of stacks 211 and 212 comprises, on its lateral faces, a new flat or substantially flat surface.

Figure 3F:
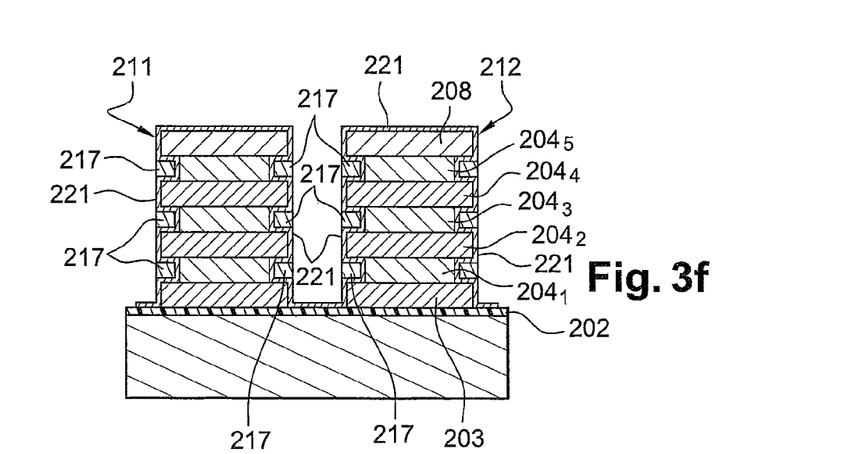

The step illustrated in FIG. 3f thus enables $Si_3N_4$ and HTO-based insulating spacers 217 to be produced; thus, on the flat lateral surfaces of stacks 211 and 212, alternating insulating bands ($Si_3N_4$+HTO) and semiconductor bands (Si) are created.

Figure 3G:
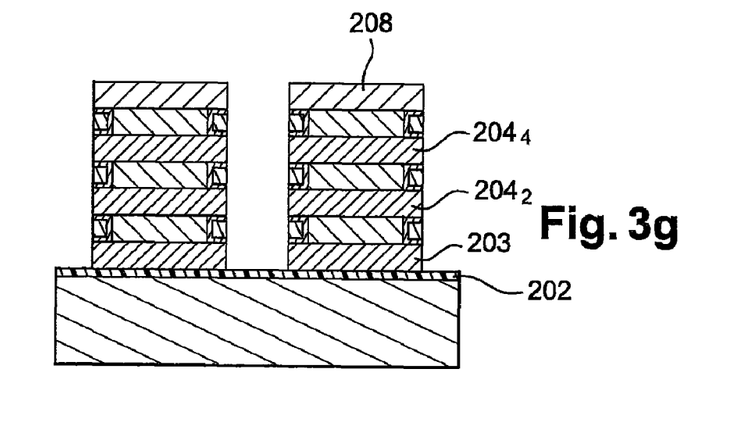

In conformance with FIG. 3g, the rest of the first dielectric HTO material 215 still present on layer 202, on the sides of layers 203, $204_2$ and $204_4$ based on the first semiconductor material Si and on the upper part of layer 208 is removed. This removal may be obtained, for example, by HF cleaning.

Figure 3H:
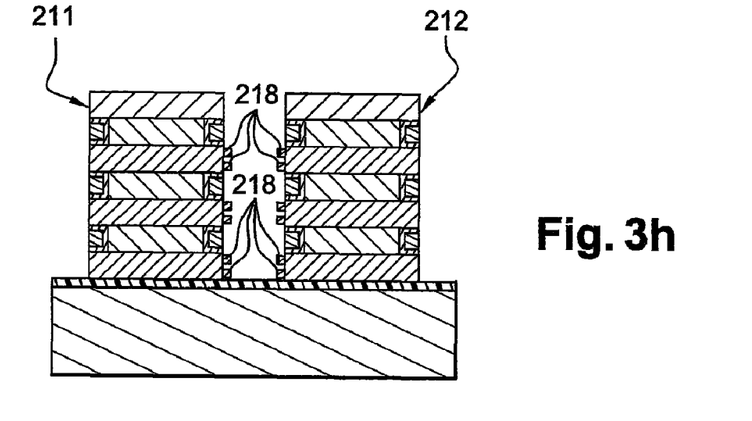

The step illustrated in FIG. 3h will consist of advantageously utilizing the reaction selectivity of the Si, on the one hand, and HTO/nitride, on the other hand, bimaterial structure, the Si being a semiconductor and the HTO/nitride being an insulator, to selectively deposit a catalyst able to promote the growth of nanowires on the silicon and not on the HTO/nitride. This deposit is then carried out thanks to functionalization of the silicon surfaces; functionalization is understood to refer to the action of attaching or grafting one or more chemical molecules on the lateral silicon bands. The object of this functionalization is to confer particular properties to the Si bands (in this instance, to promote the subsequent growth of nanowires/nanotubes).

Functionalization consists of paving the Si bands with particles or nanodots 218 (for example, Au) without covering the HTO/nitride bands.

In practice, a thin layer of native $SiO_2$ (with a thickness on the order of 1 nm) is most often formed on the Si layer and, therefore, the Au coating should be carried out on the $SiO_2$.

The functionalization (or modification of the superficial chemical properties) of the native $SiO_2$ bands consists of depositing self-assembled films or SAMS (Self-Assembled Monolayers). This type of functionalization is particularly described in the document "Self assembled monolayers on silicon for molecular electronics" (Aswal et al, Analytica chimica acta 2005). The molecules utilized to form SAMs are generally constituted of a hydrophobic surface group and a hydrophilic anchor group, both connected by an alkyl chain. The chains tend to be arranged perpendicularly to the surface forming a dense and organized structure, mainly thanks to the Van der Waals interactions present between the hydrophobic chains.

First of all, the Si surface covered by its native oxide layer is cleaned (for example via an RCA type chemical cleaning) in order to create —OH groups on the surface that will enable good grafting to be obtained. The presence of these hydroxyl groups makes the surface very hydrophilic, leading to the natural trapping of a thin water film.

In the presence of the cleaned bands, molecules of silane (typically trichlorosilane $RSiCl_3$ where R is an alkyl chain terminated by a hydrophobic surface group) are placed, that will spontaneously position their hydrophilic anchor groups (Si—$Cl_3$) towards the water layer while the head of the alkyl chain (hydrophobic) will tend to move apart.

The water layer hydrolyzes the Si—$Cl_3$ groups to form a trihydrosiloxane Si—$(OH)_3$ head.

The presence of a thin layer of liquid enables planar mobility of the molecules that then move closer together, which tends to promote the condensation reaction between adjacent molecules; Si—O—Si bonds are created between the molecules, thus forming a two-dimensional molecular layer. The same crosslinking reaction is produced between the substrate and the film formed. A monolayer of covalently grafted silane is thus obtained on the $SiO_2$ surface.

At the ends of the alkyl groups, groups such as thiols (for example SH) may then be fixed. This thiol group is very reactive with the Au such that, by depositing gold on the already treated surface, Gold-Sulfur covalent bonds are obtained.

The deposition of gold is done selectively on the bands of native $SiO_2$ and not on the bands of HTO/nitride (no —OH groups are created on the surface). By choosing a suitable Au concentration, a discrete deposition of Au nanodots can be made on the semiconductor bands and in this way the Si bands can be paved with particles or nanodots 218. The article "Electroless deposition and electrical resistivity of sub-100 nm Cu films on SAMs: State of the art" (Glickman at al—Microelectronic Engineering 84 (2007) 2466-2470) describes various examples of carrying out metal deposition on SAMs, the deposition generally being done in the form of discrete islands. The deposition of metal on SAMs may be obtained by various techniques such as oxidation-reduction without an electroless type current supply, electroplating or colloidal particle deposition methods.

The description above relates to the functionalization of native oxide but it is also possible to directly functionalize the Si bands without going through the formation of native $SiO_2$ layers.

In addition, it is possible to graft other metals such as Au; one may, for example, consider grafting metals such as Ni, Co, Pt, Pd, Rh, Ru, Fe, Al, Ag or Cu.

The functionalization step as represented in FIG. 3h may be replaced by a siliconizing step; In this way, on the lateral Si bands, an NiSi or PtSi type coating is created. The use of metal silicides is known for reducing contact resistances of the active parts of transistors. Silicide island formation is a phenomenon known to the person skilled in the art. Siliconizing is utilized here to produce an NiSi or PtSi metal catalytic coating able to promote the growth of nanotubes or nanowires. To do this, one starts by depositing a metallic layer of Ni or Pt, and then annealing is carried out that enables an NiSi or PtSi alloy to be obtained.

The remaining Ni or Pt (i.e., not having reacted with the Si) as well as the Ni or Pt deposited on the HTO/nitride insulating bands is then removed by chemical cleaning.

The metal particle 218 coating may also be obtained by electrochemical deposition of metal on the Si bands.

Figure 3I:
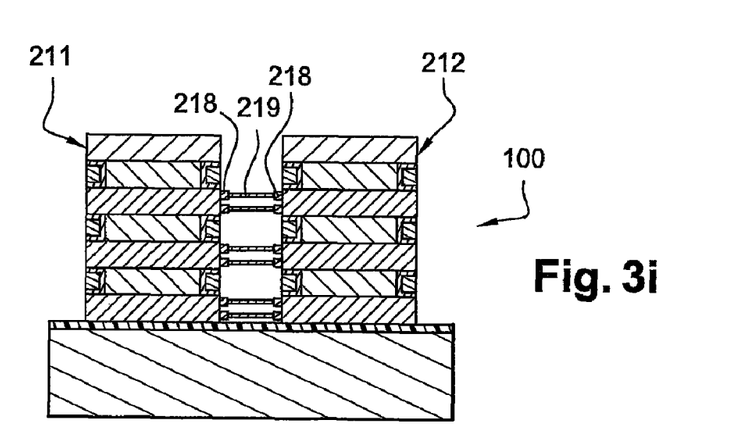

The step illustrated in FIG. 3i then consists of carrying out the growth of nanowires (typically Si nanowires) 219 connecting two nanodots 218 respectively situated on the flat lateral Si surfaces of stacks 211 and 212. To clarify the illustration, FIG. 3i represents nanowires 219 connecting each of the two nanodots 218 facing each other; the growth is random, however, it should be noted that the probability that a nanowire connects two nanodots facing each other is relatively small. Generally, the growth of nanowires will thus enable two blocks 211 and 212 to be connected but the nanowires will not necessarily join two nanodots opposite each other and will not necessarily be perfectly parallel to the substrate. One solution to obtain parallel nanowires may constitute utilizing a crystallographic growth axis favored by nanowires. This growth may be carried out by an VLS-CVD (Vapor-Liquid-Solid-Chemical-Vapor-Deposition) process or by any other process enabling the growth of nanowires. The result is a structure 100 identical to the structure represented in FIG. 1 (the particles 118 of FIG. 1 corresponding to particles 218 of FIG. 3i and the nanowires 119 of FIG. 1 corresponding to nanowires 219 of FIG. 3i).

Figure 4:
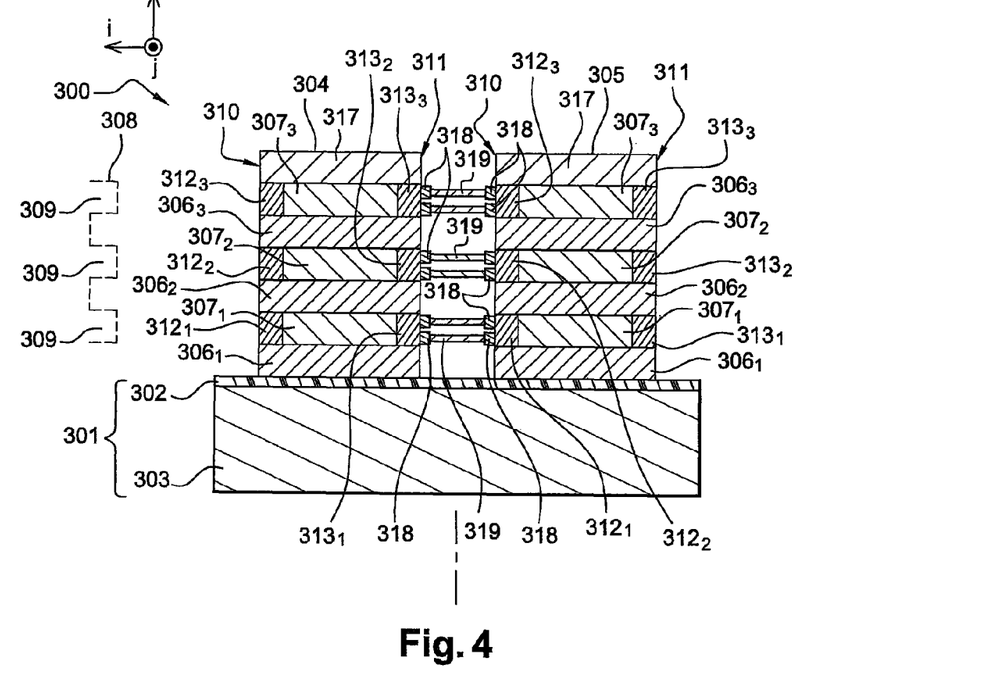
FIG. 4 represents a semiconductor structure according to a second embodiment of the invention.

FIG. 4 represents a semiconductor structure 300 according to a second embodiment of the invention.

Structure 300 comprises:
- a support 301 comprising:
    - a first semiconductor layer 303, for example based on silicon on which is built;
    - an insulating layer 302 such as a layer of buried oxide (BOX) based on $SiO_2$;
- two semiconductor blocks 304 and 305 spaced along the horizontal direction i.

Plane [o, i, j] corresponds to the horizontal plane of support 301.

Each of the two blocks 304 and 305 have an identical structure and comprise a stack of layers stacked along the vertical direction k. This stack is formed of alternating layers noted $306_1$, $306_2$ and $306_3$ based on a first semiconductor material, such as for example Si, and layers noted $307_1$, $307_2$ and $307_3$ based on a second semiconductor material different from the first semiconductor material, such as for example SiGe. The second material is preferentially chosen to be able to be etched selectively with relation to the first material.

Each of the two blocks 304 and 305 comprises, in addition, a hard mask upper layer 317, for example of $Si_3N_4$.

Layers $306_1$, $306_2$ and $306_3$ based on the first semiconductor material and layers $307_1$, $307_2$ and $307_3$ based on the second semiconductor material typically have thicknesses along direction k of between 10 and 50 nm.

The lengths along direction i of layers $306_1$, $306_2$ and $306_3$ based on the first semiconductor material are chosen longer than the lengths of layers $307_1$, $307_2$ and $307_3$ based on the second semiconductor material such that the alternating layers $306_1$, $306_2$ and $306_3$ and alternating layers $307_1$, $307_2$ and $307_3$ have a tooth or recessed lateral profile. This profile is illustrated by the broken lines 308 in FIG. 4.

The result is that each block 304 and 305 comprises, on each of its two lateral faces 310 and 311, a tooth profile with "grooves" in SiGe and projecting relief parts in Si. Each block 304 and 305 thus presents an organized vertical topography wherein the dimensions are controlled via the thickness of layers of Si and of SiGe. Spaces 309 formed by the tooth profile 308 are totally filled on each of the lateral faces 310 and 311 respectively by metal spacers $312_1$, $312_2$ and $312_3$ (lateral face 310) and by metal spacers $313_1$, $313_2$ and $313_3$ (lateral face 311). Here the spacers are made in the form of substantially parallelepiped bars made of a metallic material such as Co, Ni or Cu.

Figure 5:
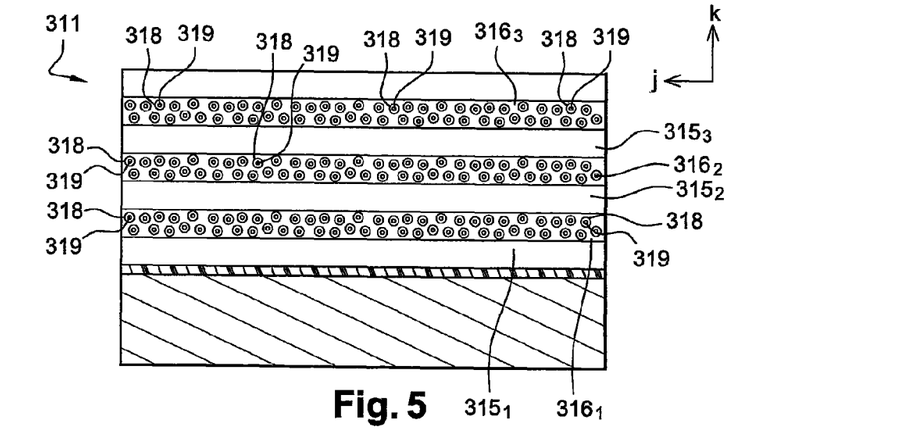
FIG. 5 represents a view of the lateral face of one of the blocks of the semiconductor structure from FIG. 4.

FIG. 5 represents a view along plane [O, j, k] of the lateral face 311 of block 304. This face 311 comprises alternating bands noted $315_1$, $315_2$ and $315_3$ based on the first semiconductor material (typically Si) and bands noted $316_1$, $316_2$ and $316_3$ based on the metallic material.

Bands $316_1$, $316_2$ and $316_3$, based on the metallic material, are coated with a metallic catalyst material able to facilitate the growth of nanotubes or nanowires. This coating takes the form of metallic particles 318. Au particles that constitute an excellent catalyst may, for example, be utilized for the growth of Si nanowires, or Ni or Fe particles may be utilized for the growth of carbon nanotubes. The metal particle 318 coating may be obtained, for example, by electrolytic deposition of metal on the metallic bands. It will be noted that the fact of having two different materials for the two types of bands $315_1$, $315_2$ and $315_3$ (in Si) and $316_1$, $316_2$ and $316_3$ (metallic and thus better conductors than Si) enables bands $316_1$, $316_2$ and $316_3$ of the catalyst material to be selectively coated by electrolytic deposition without coating bands $315_1$, $315_2$ and $315_3$.

Then these particles 318 are utilized to carry out a horizontal growth of nanowires 319 in the confined structure existing between the lateral surface 311 of block 304 and the lateral surface 310 of block 305.

The BOX insulating layer 302 enables nanowires 319 to be better insulated from the substrate formed by the first semiconductor layer 303.

Au particles may also be utilized to block the growth of carbon nanotubes; according to this embodiment, the Au particles do not act as catalysts and the carbon nanotubes will preferentially grow on bands $315_1$, $315_2$ and $315_3$ (in Si) not covered with Au. Such a growth process is, for example, described in patent application WO2006010684.

Of course, the device and method according to the invention are not limited to the embodiments that have just been described for indicative and in no way limiting purposes with reference to FIGS. 1 to 5.

In particular, even if the invention was more particularly described in the case of a structure with two nanostructured blocks, it is also possible to have a single bimaterial block with nanowires or nanotubes formed from lateral bands of this block, the nanowire or nanotube assembly being connected together to the same block formed of a single material.

The invention claimed is:

1. A semiconductor structure comprising:
   a support corresponding to a horizontal plane;
   at least one block provided on said support, said block comprising:
      a stack extending along a vertical direction of alternating layers based on a first semiconductor material and layers based on a second semiconductor material different from said first semiconductor material, said layers based on said first semiconductor material presenting greater dimensions than the layers based on said second semiconductor material such that said stack has a lateral tooth profile;
      a plurality of spacers filling spaces formed by said lateral tooth profile such that said stack presents a substantially flat vertical lateral surface, said spacers being made of a third material different from said first semiconductor material such that a vertical lateral face formed by said substantially flat vertical lateral surface presents alternating lateral bands based on said first semiconductor material and lateral bands based on said third material;
   said vertical lateral face being partially covered by a material promoting the growth of nanotubes or nanowires exclusively on the lateral bands based on said first semiconductor material or exclusively on the lateral bands based on said third material, said material promoting the growth of nanotubes or nanowires exclusively coating the lateral bands based on said first semiconductor material or exclusively coating the lateral bands based on said third material.

2. The semiconductor structure according to claim 1, wherein said material is a catalyst material for the growth of nanotubes or nanowires.

3. The semiconductor structure according to claim 1, comprising two blocks facing each other such that the lateral bands of said two blocks coated with said material promoting the growth of nanotubes or nanowires are facing each other.

4. The semiconductor structure according to claim 3, wherein said two blocks are connected by a plurality of nanowires or nanotubes, each of said nanowires or said nanotubes connecting a lateral band of the first block coated with the material promoting the growth of nanotubes or nanowires to a lateral band of the second block coated with the material promoting the growth of nanotubes or nanowires and facing the lateral band of said first block.

5. The semiconductor structure according to claim 1, wherein said material promoting the growth of nanotubes or nanowires partially coats said lateral bands in the form of particles or nanodots, spaced along said lateral bands, 6. The semiconductor structure according to claim 1, wherein a thickness of said layers based on said first semiconductor material and/or said layers based on said second semiconductor material is between 10 and 50 nm.

7. The semiconductor structure according to claim 1, wherein said first semiconductor material is Si and said second semiconductor material is SiGe.

8. The semiconductor structure according to claim 1, wherein said spacers are made of an insulating material, said material promoting the growth of nanotubes or nanowires exclusively coating the lateral bands based on said first semiconductor material, 9. The semiconductor structure according to claim 8, wherein said spacers are formed by a first part made of a first dielectric material and a second part made of a second dielectric material, said second dielectric material corresponding to said third material of the lateral bands.

10. The semiconductor structure according to claim 9, wherein said first dielectric material is $SiO_2$ and said second dielectric material is silicon nitride of the Si3N4 type, 11. The semiconductor structure according to claim 1, wherein said third material of said spacers is a metal, said material promoting the growth of nanotubes or nanowires exclusively coating the lateral bands based on said metal.

12. The semiconductor structure according to claim 1, wherein said support is a substrate comprising a semiconductor layer.

13. The semiconductor structure according to claim 1, wherein the substrate is a substrate of the SOI, Si or Ge type.

14. A transistor integrating a structure according to claim 1, wherein said structure comprises a plurality of nanowires or nanotubes, each forming a transistor channel.

15. A semiconductor structure comprising:
a support ;
at least one block built on said support, said block comprising:
a stack extending along a direction perpendicular to a plane of the support of alternating layers based on a first semiconductor material and layers based on a second semiconductor material different from said first semiconductor material, said layers based on said first semiconductor material presenting greater dimensions than the layers based on said second semiconductor material such that said stack has a lateral tooth profile;
a plurality of spacers filling spaces formed by said lateral tooth profile such that said stack presents a substantially flat lateral surface along said direction perpendicular to the plane of the support, said spacers being made of a third material different from said first semiconductor material such that a lateral face formed by the substantially flat lateral surface presents alternating lateral bands based on said first semiconductor material and lateral bands based on said third material;
said lateral face being partially covered by a material promoting the growth of nanotubes or nanowires exclusively on the lateral bands based on said first semiconductor material or exclusively on the lateral bands based on said third material, said material promoting the growth of nanotubes or nanowires exclusively coating the lateral bands based on said first semiconductor material or exclusively the lateral bands based on said third material, 16. The semiconductor structure according to claim 15, comprising two blocks facing each other such that the lateral bands of said two blocks coated with said material promoting the growth of nanotubes or nanowires are facing each other.

17. The semiconductor structure according to claim 15, wherein said material promoting the growth of nanotubes or nanowires partially coats said lateral bands in the form of particles or nanodots, spaced along said lateral bands.

18. The semiconductor structure according to claim 15, wherein a thickness of said layers based on said first semiconductor material and/or said layers based on said second semiconductor material is between 10 and 50 nm.

19. The semiconductor structure according to claim 15, wherein said third material of said spacers is a metal, said material promoting the growth of nanotubes or nanowires exclusively coating the lateral bands based on said metal.

20. A semiconductor structure comprising:
a support;
a block arranged on a surface of the support, the surface defining a plane of the support, said block comprising:
an alternating arrangement of a first and a second layer that are stacked along a direction substantially perpendicular to said plane of the support, the first layer including a first semiconductor material and the second layer including a second semiconductor material that is different from said first semiconductor material, said first and second layers being arranged such that a stack of said first and second layers presents a lateral tooth profile along said direction;
a plurality of spacers filling spaces formed by said lateral tooth profile such that a stack of said first and second layers and said spacers presents a substantially flat lateral surface along said direction, said spacers being made of a third material different from said first semiconductor material such that a lateral face formed by the substantially flat lateral surface presents an alternating assembly of lateral bands based on said first semiconductor material and lateral bands based on said third material;
said lateral face being partially covered by a material promoting the growth of nanotubes or nanowires, said material promoting the growth of nanotubes or nanowires being exclusively coated on the lateral bands based on said first semiconductor material or exclusively coated on the lateral bands based on said third material.

* * * * *